United States Patent (10) Patent No.: US 8,787,080 B2
Sommer et al. (45) Date of Patent: *Jul. 22, 2014

(54) SELECTIVE RE-PROGRAMMING OF ANALOG MEMORY CELLS

(75) Inventors: Naftali Sommer, Rishon Le-Zion (IL); Uri Perlmutter, Ra'anana (IL); Shai Winter, Herzliya (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/539,759

(22) Filed: Jul. 2, 2012

(65) Prior Publication Data
US 2012/0268990 A1  Oct. 25, 2012

Related U.S. Application Data

(63) Continuation of application No. 12/758,003, filed on Apr. 11, 2010, now Pat. No. 8,238,157.

(60) Provisional application No. 61/168,604, filed on Apr. 12, 2009.

(51) Int. Cl.
*G11C 16/04* (2006.01)

(52) U.S. Cl.
USPC ............ 365/185.03; 365/185.18; 365/185.19; 365/185.22

(58) Field of Classification Search
USPC .............. 365/185.03, 185.18, 185.19, 185.22
See application file for complete search history.

(56) References Cited

U.S. PATENT DOCUMENTS

| 5,533,190 | A | 7/1996 | Binford et al. |
| 6,314,044 | B1 | 11/2001 | Sasaki et al. |
| 6,480,948 | B1 | 11/2002 | Virajpet et al. |
| 6,732,250 | B2 | 5/2004 | Durrant |
| 7,158,058 | B1 | 1/2007 | Yu |
| 7,312,727 | B1 | 12/2007 | Feng et al. |
| 7,487,394 | B2 | 2/2009 | Forhan et al. |
| 7,574,555 | B2 | 8/2009 | Porat et al. |
| 7,661,000 | B2 | 2/2010 | Ueda et al. |
| 7,797,609 | B2 | 9/2010 | Neuman |
| 7,904,783 | B2 | 3/2011 | Brandman et al. |
| 7,924,587 | B2 | 4/2011 | Perlmutter |

(Continued)

OTHER PUBLICATIONS

Budilovsky et al., "Prototyping a High-Performance Low-Cost Solid-State Disk", SYSTOR—The 4th Annual International Systems and Storage Conference, Haifa, Israel, May 30-Jun. 1, 2011.

(Continued)

*Primary Examiner* — Pho M Luu
(74) *Attorney, Agent, or Firm* — Meyertons, Hood, Kivlin, Kowert & Goetzel, P.C.

(57) ABSTRACT

A method for data storage includes defining, in a memory that includes multiple analog memory cells, an erased state, a set of non-erased programming states and a partial subset of the non-erased programming states. Data is initially stored in a first group of the analog memory cells by programming each of at least some of the memory cells in the first group from the erased state to a respective non-erased programming state selected from the set of non-erased programming states. After initially storing the data, a second group of the analog memory cells, which potentially cause interference to the first group, is programmed. After programming the second group, the first group is selectively re-programmed with the data by repeating programming of only the memory cells in the first group whose respective programming states belong to the partial subset.

17 Claims, 4 Drawing Sheets

(56) References Cited

U.S. PATENT DOCUMENTS

| | | |
|---|---|---|
| 7,929,549 B1 | 4/2011 | Talbot |
| 7,995,388 B1 * | 8/2011 | Winter et al. ............ 365/185.03 |
| 8,000,135 B1 | 8/2011 | Perlmutter |
| 8,050,086 B2 * | 11/2011 | Shalvi et al. ............. 365/185.02 |
| 8,065,583 B2 | 11/2011 | Radke |
| 8,085,586 B2 * | 12/2011 | Golov et al. ............. 365/185.03 |
| 8,238,157 B1 * | 8/2012 | Sommer et al. .......... 365/185.03 |
| 8,259,506 B1 * | 9/2012 | Sommer et al. .......... 365/185.24 |
| 8,498,151 B1 * | 7/2013 | Winter et al. ............ 365/185.03 |
| 8,527,819 B2 | 9/2013 | Shalvi |
| 2005/0144361 A1 | 6/2005 | Gonzalez et al. |
| 2007/0104211 A1 | 5/2007 | Opsasnick |
| 2008/0123426 A1 | 5/2008 | Lutze et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0149657 A1 | 6/2011 | Haratsch et al. |

OTHER PUBLICATIONS

NVM Express Protocol, "NVM Express", Revision 1.0b, Jul. 12, 2011.

SCSI Protocol, "Information Technology—SCSI Architecture Model-5 (SAM-5)", INCITS document Tl0/2104-D, revision 01, Jan. 28, 2009.

SAS Protocol, "Information Technology—Serial Attached SCSI-2 (SAS-2)", INCITS document Tl011760-D, revision 15a, Feb. 22, 2009.

* cited by examiner

US 8,787,080 B2

SELECTIVE RE-PROGRAMMING OF ANALOG MEMORY CELLS

CROSS-REFERENCE TO RELATED APPLICATIONS

This application is a continuation of U.S. patent appplication Ser. No. 12/758,003, filed Apr. 1, 2010, now U.S. Pat. No. 8,238,157, which claims the benefit of U.S. Provisional Patent Application 61/168,604, filed Apr. 12, 2009. The disclosures of all these related applications are, whose disclosure is incorporated herein by reference.

FIELD OF THE INVENTION

The present invention relates generally to memory devices, and particularly to methods and systems for re-programming analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (RAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention provides a method for data storage, including:

in a memory that includes multiple analog memory cells, defining an erased state, a set of non-erased programming states and a partial subset of the non-erased programming states;

initially storing data in a first group of the analog memory cells by programming each of at least some of the memory cells in the first group from the erased state to a respective non-erased programming state selected from the set of non-erased programming states;

after initially storing the data, programming a second group of the analog memory cells, which potentially cause interference to the first group; and after programming the second group, selectively re-programming the first group with the data by repeating programming of only the memory cells in the first group whose respective programming states belong to the partial subset.

In some embodiments, initially storing the data includes writing respective storage values into the memory cells in the first group and verifying the written storage values using first verification thresholds, and selectively re-programming the first group includes re-writing the storage values that are associated with the partial subset, and verifying the re-written storage values using second verification thresholds, higher than the corresponding first verification thresholds. In an embodiment, programming the memory cells includes writing respective storage values into the memory cells, and defining the partial subset includes including in the partial subset at least a non-erased programming state corresponding to a lowest range of the analog values among the non-erased memory states. In a disclosed embodiment, programming the memory cells includes writing respective storage values into the memory cells, and defining the partial subset includes including in the partial subset at least a non-erased programming state corresponding to a highest range of the analog values among the non-erased memory states.

In some embodiments, the method includes programming the second group with dummy data responsively to detecting that programming of the second group is postponed, so as to cause re-programming of the first group. In an embodiment, detecting that the programming of the second group is postponed includes detecting that a time that elapsed since the programming of the second group exceeds a predefined maximum value. In another embodiment, detecting that the programming of the second group is postponed includes determining that shut-off of electrical power is imminent.

In a disclosed embodiment, upon preparing to read the data from the first group, the method includes applying a corrective action to the first group responsively to detecting that that the first group was not re-programmed. Applying the corrective action may include programming the second group with dummy data, so as to cause re-programming of the first group. Additionally or alternatively, applying the corrective action may include sensing at least one analog value that was written into a respective analog memory cell in the first group and has become negative. Further additionally or alternatively, applying the corrective action may include applying one or more programming pulses to at least one of the memory cells in the first group.

There is additionally provided, in accordance with an embodiment of the present invention, apparatus for data storage, including:

a memory, which includes multiple analog memory cells; and circuitry, which is configured to define an erased state, a set of non-erased programming states and a partial subset of the non-erased programming states, to initially store data in a first group of the analog memory cells by programming each of at least some of the memory cells in the first group from the erased state to a respective non-erased programming state selected from the set of non-erased programming states, to program a second group of the analog memory cells, which potentially cause interference to the first group, after initially storing the data, and, after programming the second group, to selectively re-program the first group with the data by repeating programming of only the memory cells in the first group whose respective programming states belong to the partial subset.

The present invention will be more fully understood from the following detailed description of the embodiments thereof, taken together with the drawings in which:

DETAILED DESCRIPTION OF EMBODIMENTS

Overview

Figure 1:
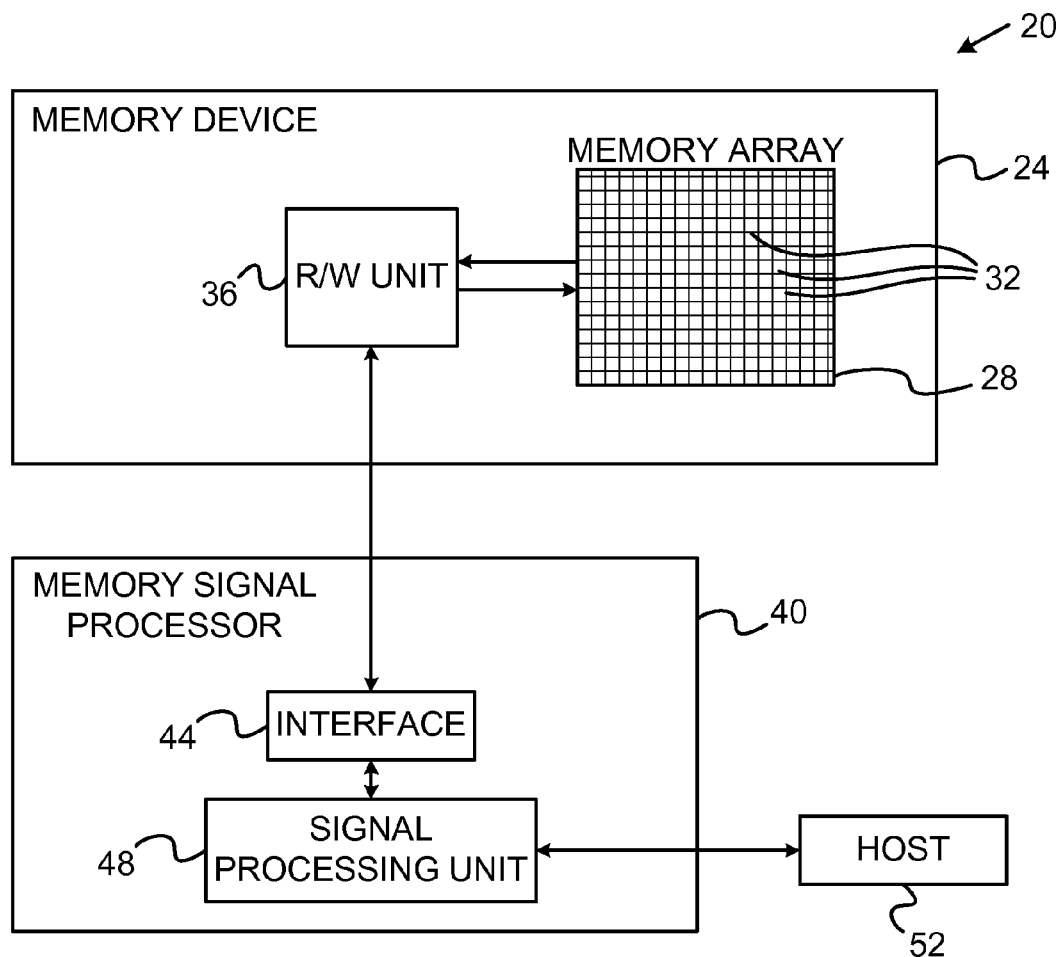
FIG. 1 is a block diagram that schematically illustrates a memory system, in accordance with an embodiment of the present invention.

Data storage in analog memory cells is typically performed by writing a respective analog value (also referred to as storage value) to each memory cell. The storage operation programs at least some of the memory cells from an erased state to respective non-erased programming states, selected from a predefined set of programming states. (The erased state is also regarded herein as a programming state. Programming states other than the erased state are referred to as non-erased programming states.) Data readout typically involves reading the analog values from the memory cells and determining, based on the read analog values, the programming state of each memory cell. In practical memory devices, however, a given memory cell may suffer from interference from other memory cells, and this interference may cause read errors.

Typically, the interference is caused by cross-coupling from neighboring memory cells.

Embodiments of the present invention that are described hereinbelow provide improved methods and systems for programming analog memory cells. The disclosed techniques reduce interference effects by programming a group of memory cells in two phases. The first phase is performed before programming of potentially-interfering memory cells. The second phase, which is referred to as re-programming, is performed after the potentially-interfering memory cells are programmed. The second programming phase comprises an iterative process, which applies programming pulses to the memory cells until the analog values of the memory cells reach certain verification thresholds. Since the second programming phase is performed after the potential interference is already present, the iterative programming and verification process inherently compensates for the interference.

In some cases, however, two-phase programming may cause performance degradation. For example, the verification thresholds used during the second programming phase are typically higher than the respective verification thresholds used in the first programming phase. The need to assign different verification thresholds to the two phases increases the overall range of analog values. As a result, memory cells are more likely to suffer from over-programming, because the analog values may reach higher maximum values. The likelihood of analog values drifting below zero and becoming unreadable may also increase, for example when one of the programming states is assigned analog voltages that are closer to 0V. In other cases, the separation between adjacent memory states may be reduced, thus increasing the likelihood of read errors.

In some embodiments, performance degradation is reduced by defining a partial subset of the non-erased programming states, and applying the second programming phase selectively, only to the memory cells whose programming states belong to the partial subset. Programming states that are outside the predefined subset are programmed only in the first programming phase. Re-programming may be omitted, for example, for the lowest and highest non-erased programming states (i.e., the non-erased programming states corresponding to the lowest and highest analog values). By applying re-programming only to a predefined subset of the non-erased programming states, only the programming states in the subset typically have different verification thresholds for the first and second phases. As a result, the overall range of analog voltages can be reduced, and the separation between adjacent programming states can be increased.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM, Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming states are selected from a finite set of possible states, and each programming state corresponds to a certain nominal storage value. For example, a 2 bit/cell MLC can be programmed to assume one of four possible programming states by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these/values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are some times sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Such blocks are referred to herein as erasure blocks or memory blocks. Typical memory devices may comprise several thousand erasure blocks, in a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

In some embodiments, R/W unit 36 programs memory cells 32 using an iterative Program and Verify (P&V) process. In a typical P&V process, an entire group of memory cells (e.g., a word line) is programmed by applying a sequence of programming pulses to the memory cells in the group. The storage values programmed in the cells are read after each pulse and compared ("verified") with one or more verification thresholds. The programming iterations continue selectively only for memory cells that have not yet reached the desired levels.

Re-Programming of Selected Memory States

Figure 2A:
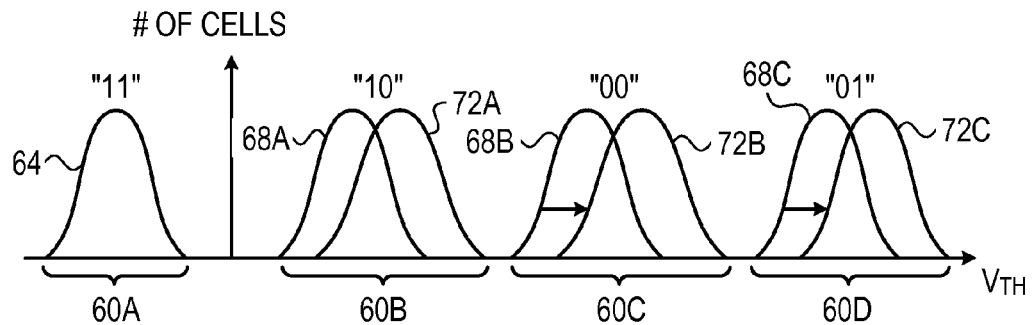
FIGS. 2A-2C are graphs showing programming states and threshold voltage distributions in a group of analog memory cells, in accordance with embodiments of the present invention.
Figure 2B:
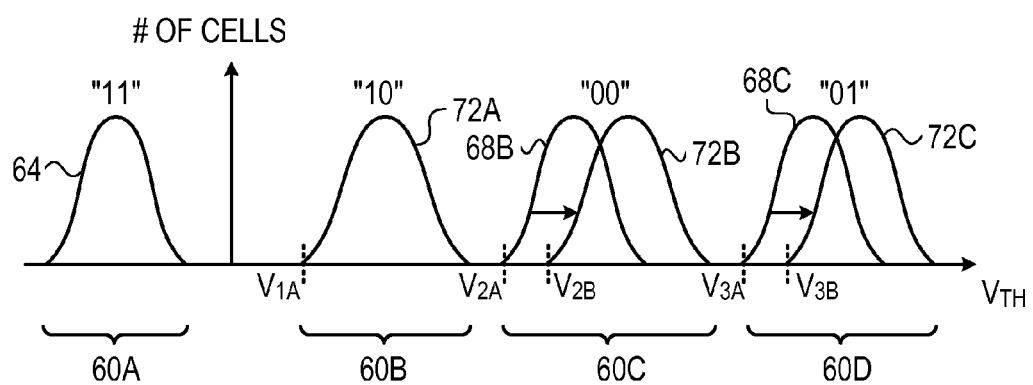
Figure 2C:
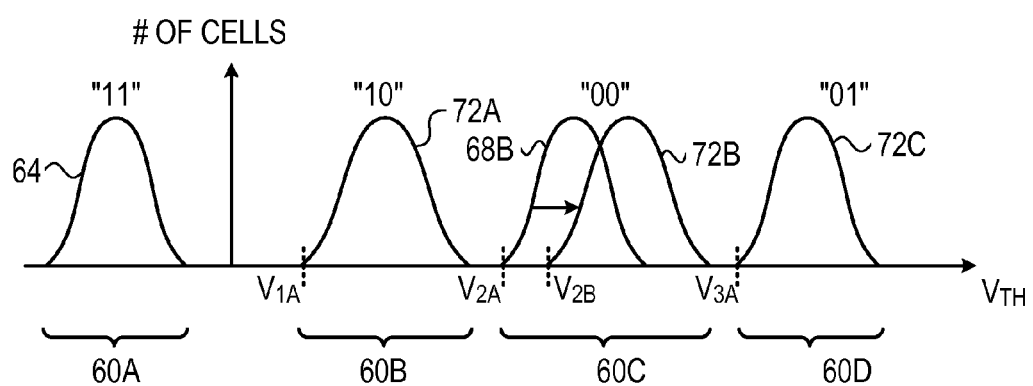

FIGS. 2A-2C are graphs showing programming states and threshold voltage distributions for several example re-programming schemes, in accordance with embodiments of the present invention. These examples refer to a group (e.g., a word line) of four-level memory cells, each memory cell storing two bits of data. Each memory cell in the group can be programmed to one of four programming states 60A . . . 60D, representing two-bit combinations "11", "10", "00" and "01", respectively. Programming state 60A, also represents erased memory cells, and is referred to herein as an erased state. States 60B-60D in this example are referred to as non-erased states. Typically although not necessarily, the memory cells that are associated with the erased state have negative threshold voltages, and the memory cells that are associated with the non-erased states have positive threshold voltages.

FIG. 2A shows an example in which re-programming is applied to all three non-erased programming states. This example is depicted herein as a reference, in order to demonstrate the advantages of the disclosed techniques. In the example of FIG. 2A, the memory cells in the group are initially erased, i.e., associated with state 60A. At this stage, the threshold voltages of the memory cells are distributed in accordance with a distribution 64.

In a first programming phase, each memory cell is programmed with two data bits, i.e., to one of the four states 60A . . . 60D. Programming typically comprises an iterative P&V process. (Memory cells that are programmed with "11" do not receive programming pulses and thus remain at state 60A.) The first programming phase is designed so that the threshold voltages of the memory cells associated with non-erased states 60 . . . 60D are distributed in accordance with distributions 68A . . . 68C, respectively. The memory cells associated with state 60A remain distributed according to distribution 64.

The first programming phase is carried out before programming of at least some of the memory cells that potentially cause interference to the cell group in question. After the first programming phase, the potentially-interfering memory cells (e.g., a neighboring word line) are programmed. A second programming phase is performed after the potentially-interfering memory cells are programmed.

In the second programming phase ("a re-programming phase"), the threshold voltages of the memory cells that are associated with non-erased states 60B . . . 60D are increased. After the second programming phase, the threshold voltages of the memory cells associated with non-erased states 60B . . . 60D are distributed in accordance with distributions 72A . . . 72C, respectively. The second programming phase is typically performed using an iterative P&V process.

Since the second programming phase is performed while the interference from neighboring memory cells is already present, the second programming phase inherently compensates for this interference. Typically, the average increase in threshold voltage (the displacement of distributions 72A . . . 72C relative to distributions 68A . . . 68C, respectively) depends on the amount of expected interference that is to be compensated for.

As can be seen in FIG. 2A, each non-erased state that is programmed in two phases is associated with a relatively large interval on the threshold voltage axis. These large intervals are important, for example, when the memory cells are subjected to a long retention period after performing only the first programming phase. In particular, state 60B may occupy a range of relatively small positive threshold voltages. In this scenario, the likelihood of threshold voltages in state 60B drifting below 0V and becoming unreadable may increase. Additionally or alternatively, the overall range of threshold voltages (sometimes referred to as "voltage window") is increased. A large voltage window may increase the likelihood of over-programming memory cells.

The effect on the voltage window caused by re-programming can be seen in the example of FIG. 2A. In this example, the final desired positions of programming states 60B . . . 60D are at distributions 72A . . . 72C, respectively. In the first programming phase, the memory cells are programmed to distributions 68A . . . 68C. In the second programming phase, the memory cells are re-programmed to the final distributions 72A . . . 72C. The average displacement of distributions 72A . . . 72C relative to distributions 68A . . . 68C, respectively, is denoted d. If only the first programming phase is executed, and then the memory cells are subject to a retention period, the data still needs to be retained reliably. Therefore, the lowest edge of distribution 68A should have sufficient margin above 0V. Typically, the lowest edge of distribution 68A is positioned at a similar value to the case in which re-programming is not applied to programming state 60B. Distributions 72A . . . 72C (the final positions of states 60B . . . 60D) are shifted by d relative to this position. Thus, the re-programming operation causes an increase of d in the voltage window.

FIGS. 2B and 2C show examples of selective re-programming schemes, in accordance with embodiments of the present invention. In these schemes, system 20 programs only a partial subset of the non-erased programming states using two programming phases. The system programs one or more of the non-erased programming states using a single programming phase, i.e., without re-programming.

In the example of FIG. 2B, non-erased programming states 60C and 60D are programmed using two programming phases, as described above. Non-erased programming state 60B, on the other hand, is programmed using a single programming phase. As can be seen in the figures, the range of threshold voltages occupied by state 60B in FIG. 2B is narrower than the range of threshold voltages occupied by this state in FIG. 2A. As a result, state 60B in FIG. 2B is positioned further away from 0V in comparison with state 60B in FIG. 2A. Therefore, the scheme of FIG. 2B has a lower likelihood that threshold voltages of memory cells in state 60B will drift below 0V and become unreadable.

In the alternative example of FIG. 2C, only state 60C is programmed using two programming phases. States 60B and 60 are programmed using a single programming phase. As a result, the threshold voltage ranges occupied by states 60B and 60D in FIG. 2B are narrower than the corresponding ranges occupied by these states in FIG. 2A. Refraining from re-programming the highest programming state (state 60D) is sometimes advantageous for a number of reasons. For example, the programming sequence is typically faster, since the programming pulses do not need to reach the high end of the voltage window. Additionally, interference that affects this state typically does not cause read errors, since there is no adjacent programming state above it.

As can be seen in FIGS. 2B and 2C, in the first programming phase, programming states 60B and 60C occupy threshold voltage ranges that are relatively close to one another (see the relatively small separation between distributions 72A and 68B). Nevertheless, this separation does not cause performance degradation because at this stage (after the first programming phase) the memory cells are subject to little or no interference. In this situation, small separation between the programming states is typically sufficient. When interference appears (as a result of programming the neighboring memory cells), it is immediately compensated for by the second programming phase. Thus, there is no situation in which programming states 60B and 60C are read when their threshold voltage distributions are too close apart.

System 20 can use the narrower threshold voltage ranges in the schemes of FIGS. 2B and 2C to (1) further increase the distance of state 60B from 0V, (2) increase the separation between adjacent programming states, and/or (3) reduce the maximum threshold voltage reached by state 60D.

As noted above, the first and second programming phases may be implemented using iterative Programming and Verification (P&V) processes. In some embodiments, system 20 programs the memory cells to different threshold voltage distributions in the first and second programming phases by using a different set of verification thresholds in each programming phase.

Consider, for example, programming state 60C in FIG. 2B. In the first programming phase, system 20 programs the memory cells associated with state 60C to reach distribution 68B by verifying the cell threshold voltages using a verification threshold denoted $V_{2A}$. In the second programming phase, system 20 programs the memory cells associated with this state to reach distribution 72B by using a higher verification threshold $V_{2B}$. The memory cells of state 60D (FIG. 2B) undergo a similar process: in the first programming phase, system 20 programs these memory cells using a verification threshold $V_{3A}$, so as to produce distribution 68C. In the second programming phase, system 20 programs the memory cells of state 60D using a higher verification threshold $V_{3B}$, so as to produce distribution 72C.

For programming states that are programmed in a single programming phase, i.e., without re-programming, system 20 uses a single verification threshold. See, for example, state 60B in FIG. 2B, which is programmed using a single verification threshold VIA. State 60D in FIG. 2C, too, is programmed using only verification threshold $V_{3A}$.

Re-programming of a given programming state is performed using a higher verification threshold in order to compensate for interference, and particularly since the cell threshold voltages can only be increased and not decreased. Consider, for example, interference that occurs after the first programming phase and causes an increase in the cell threshold voltage. If the verification threshold of the second programming phase is higher than this increased threshold voltage, then the re-programming operation will be able to compensate for the interference. Otherwise, i.e., if the difference between the verification thresholds in the first and second programming phases is too small, some or even all of the interference may not be compensated for.

In some embodiments, system 20 can implement the selective re-programming scheme described herein by applying both the first and the second programming phases to all the memory cells in the group. In these embodiments, the verification thresholds are increased between the first and the second programming phases only for the programming states in which re-programming is employed. For the programming states in which re-programming is omitted, the verification thresholds are not increased between the first and the second programming phases.

The examples of FIGS. 2B and 2C refer to four-level memory cells. This choice, however, is made purely by way of example. In alternative embodiments, the selective re-programming schemes described herein can be used with memory cells having any desired number of programming states, such as eight-level or sixteen-level memory cells. In alternative embodiments, any other suitable subset of the non-erased programming states can be chosen for re-programming.

Note that the second programming phase in the disclosed techniques does not write additional data into the memory cells beyond the data that was programmed by the first programming phase (i.e., it does not modify the programming states of the memory cells). Rather, the second programming phase shifts the cell threshold voltages within the same programming states in order to compensate for interference. The disclosed two-phase schemes should be distinguished from programming schemes that program additional data into the memory cells (and thus modify the programming states of the memory cells) in subsequent programming stages.

The selective re-programming schemes described herein can be applied by MSP 40, by R/W unit 36 in memory device 24, or jointly by the R/W unit and MSP. The element or elements performing these functions, in hardware and/or in software, are sometimes referred to herein as circuitry that carries out the methods described herein.

Figure 3:
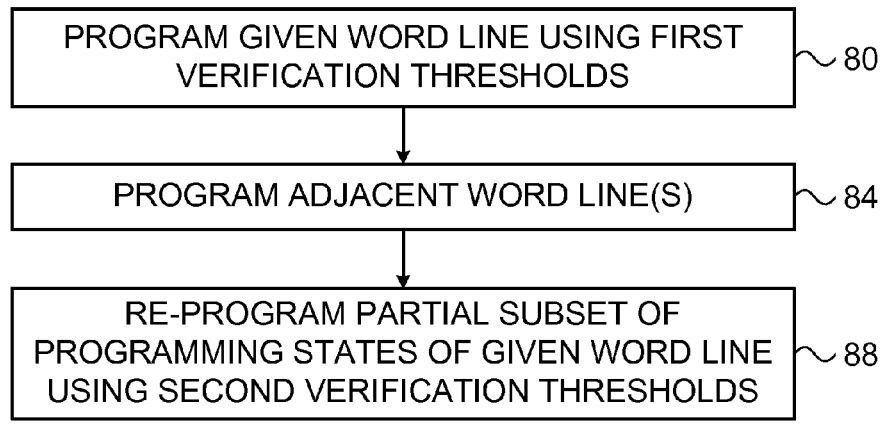
FIG. 3 is a flow chart that schematically illustrates a method for selective re-programming of analog memory cells, in accordance with an embodiment of the present invention.

FIG. 3 is a flow chart that schematically illustrates a method for selective re-programming of analog memory cells, in accordance with an embodiment of the present invention. The method begins with system 20 initially programming a group of memory cells 32, in the present example a word line that is referred to as a target word line, at a first phase programming step 80. In the first programming phase, system 20 applies an iterative P&V process that uses certain verification thresholds, so as to reach the desired threshold voltage distributions.

After the first programming phase, system 20 programs a group of memory cells that potentially cause interference to the target word line, at an interfering cell programming step 84. In the present example, system 20 programs an adjacent word line, whose memory cells potentially cause interference to the target word line.

After programming the adjacent word line, system 20 selectively re-programs the memory cells of the target word line, at a second phase programming step 88. In the second programming phase, system 20 re-programs only the memory cells that are associated with a predefined partial subset of the non-erased programming states. In the schemes of FIGS. 2B and 2C above, the non-erased programming states comprise states 60B ... 60D. In the example of FIG. 2B, the partial subset comprises only states 60C and 60D. In the example of FIG. 2C, the partial subset comprises only state 60C. When re-programming the memory cells in a given non-erased programming state, system 20 uses a higher verification threshold than the verification threshold that was used to program these memory cells in the first programming phase.

In the example embodiments described herein, the interference is caused by memory cells in an adjacent word line. This sort of interference is sometimes referred to as vertical interference. The disclosed techniques, however, can be used to compensate for interference that is caused by any other group of memory cells, not necessarily in an adjacent word line. In some embodiments, interference may be caused by memory cells in the same word line as the interference group of memory cells. This sort of interference is sometimes referred to as horizontal interference. For example, in some memory devices a given page is stored in the even-order memory cells of a given word line, and another page is stored in the odd-order memory cells of the same word line. Interference may be caused from the odd-order cells to the even-order cells, or vice versa.

Readout from Partially-Programmed Memory Blocks

In some embodiments, array 28 is partitioned into multiple memory blocks, also referred to as erasure blocks or simply blocks. Each block comprises multiple word lines. When storing data in a given block, system 20 typically programs the word lines of the block in sequential order.

When using the selective re-programming schemes described above, system 20 typically programs the block in the following order:
- Apply the first programming phase to word line N.
- Apply the first programming phase to word line N+1.
- Go back and apply the second programming phase to word line N.
- Apply the second programming phase to word line N+1.
- Apply the first programming phase to word line N+2.
- Continue programming in the same manner, until filling the block.

Other programming orders can also be used. Certain aspects of using different word line programming orders are addressed in PCT International Publication WO 2009/037691, whose disclosure is incorporated herein by reference.

In practice, however, programming of a given block may terminate before all the word lines of the block are programmed. For example, the stored data may not occupy an entire block or an integer number of blocks. As another example, electrical power may be removed from system 20 before all the word lines of the block are programmed. Alternatively, system 20 may not complete the programming of all word lines in the block for any other reason.

In particular, if word line N+1 is not programmed, then the above-described programming sequence may not continue, and word line N may not be re-programmed. In some embodiments, re-programming of word line N is performed immediately after first-phase programming of word line N+1, often in the same programming command from the user's perspective. If programming stops after first-phase programming of word line N, this word line will not be re-programmed.

In other words, when the programming of a certain block stops before all its word lines are programmed, the last-programmed word line in the block may remain programmed using only the first programming phase. Referring to FIG. 2B, for example, the threshold voltages in the last-programmed word line may be distributed according to distributions 64, 72A, 68B and 68C, instead of 64, 72A, 72B and 72C. In particular, threshold voltages of memory cells belonging to the lowest non-erased state (state 60B in the example of FIGS. 2A-2C) may drift below 0V after retention.

Even if word line N+1 were re-programmed at this stage, the re-programming operation would occur when the interference from the next word line is not present, and therefore cannot compensate for the interference. Attempting to read such a word line may cause read errors. In some embodiments, system 20 (typically MSP 40) takes measures to correct the programming of the last-programmed word line in a partially-programmed block.

(In some MLC devices, each word line stores multiple pages, which are not necessarily programmed at the same time. In some embodiments, a word line is considered the last-programmed word line in the block if the next word line is not programmed at all. In other embodiments, a word line is considered the last-programmed word line in the block if the next word line is not fully-programmed with all the possible pages. Further alternatively, the last-programmed word line in the block may be defined as the word line that holds the most-recently-programmed page in the block.)

For example, system 20 may program the word line that follows the last-programmed word line artificially with dummy data. In some embodiments, artificial programming of word line N+1 by MSP 40 causes memory device 24 to re-program word line N. The MSP may program word line N+1 with constant data, with a fixed data pattern, with random data, or with any other suitable data. In an example embodiment, the MSP programs word line N+1 with a pattern that generates peak interference. Such patterns typically perform better in increasing the threshold voltages of word line N above zero. The artificial programming wastes word line N+1, but on the other hand enables re-programming of word line N.

Figure 4:
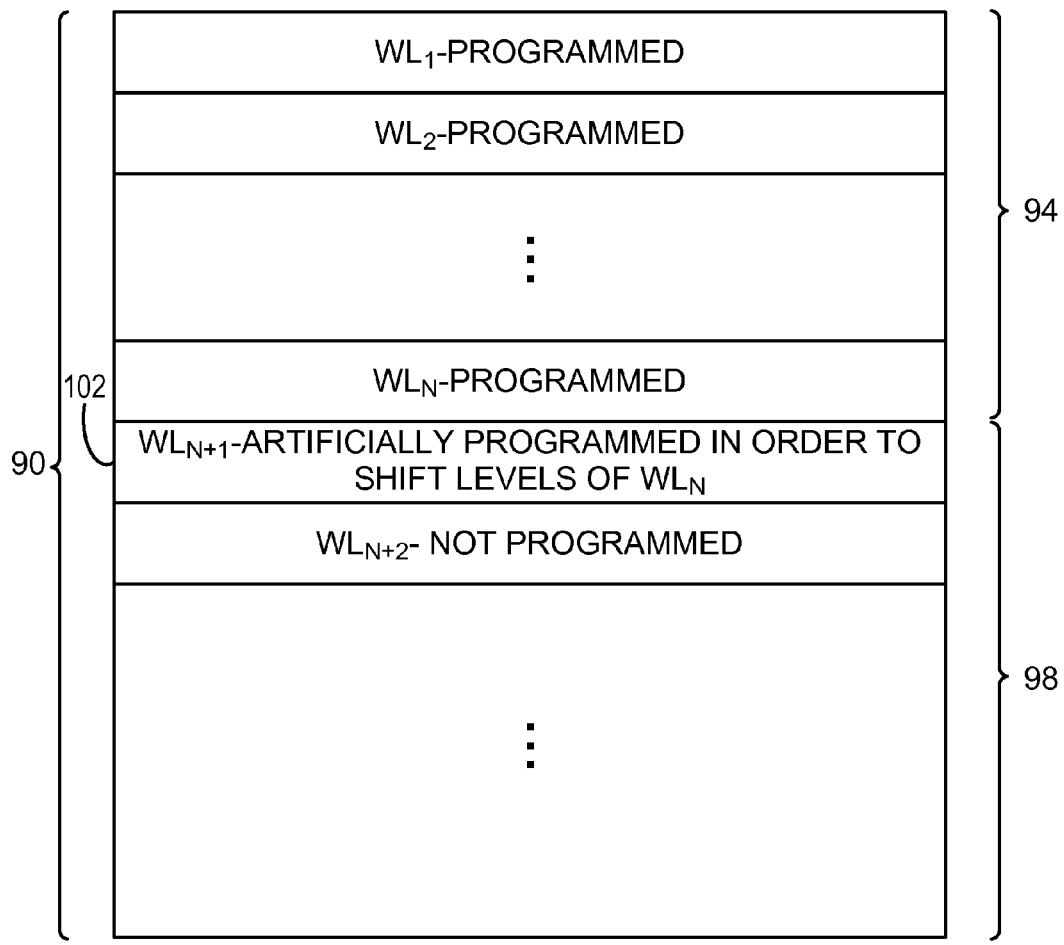
FIG. 4 is a diagram that schematically illustrates a partially-programmed memory block, in accordance with an embodiment of the present invention.

FIG. 4 is a diagram that schematically illustrates a partially-programmed memory block, in accordance with an example embodiment of the present invention. FIG. 4 shows a memory block 90, which comprises multiple word lines denoted $WL_1, WL_2, \ldots$ A certain range 94, comprising word lines $WL_1 \ldots WL_N$, is programmed with data. A subsequent range 98, comprising the remaining word lines of the block, is not programmed. In order to cause memory device 24 to re-program the last-programmed word line $WL_N$, MSP 40 artificially programs a word line 102 ($WL_{N+1}$) with dummy data.

System 20 may decide to program word line N+1 with dummy data in response to various conditions or events. For example, the MSP may measure the time that elapsed since programming of the last page in the block. If the elapsed time exceeds a certain value, the MSP may deduce that the block is likely to remain partially-programmed, and therefore decide to program word line N+1 with dummy data. As another example, the MSP may sense (or receive a notification) that the electrical power supply to system 20 is about to be shut-off. In order to prepare for power removal, the MSP may decide to program word line N+1 with dummy data and cause re-programming of word line N. Further alternatively, the MSP may decide to program word line N+1 with dummy data in response to any other suitable condition or event.

The description above refers to programming word line N+1 with dummy data when word line N is the last word line that is programmed in a partially-programmed block. Alternatively, however, system 20 may decide to program word line N+1 with dummy data upon detecting that the programming of word line N+1 is postponed for any other reason.

In alternative embodiments, the MSP performs certain corrective actions in order to read the last-programmed word line in a partially-programmed block, assuming that this word line did not undergo re-programming. These corrective actions are taken in preparation for reading the word line, sometimes long after programming. For example, the MSP may program the next word line (word line N+1) with dummy data. As explained above, this programming causes the memory device to go back and re-program word line N. In the present example, however, programming of word line N+1 is performed at readout time (possibly following a long retention period) and not at programming time.

As another example of a corrective action, the MSP may apply a readout process that senses the threshold voltages of the memory cells in word line N even if they are negative, i.e., have drifted below 0V. The MSP may use any suitable technique for sensing negative threshold voltages. Example methods are described in U.S. Patent Application Publication 2008/0181001, whose disclosure is incorporated herein by reference. This technique is particularly suitable for scenarios in which some of the cell threshold voltages have drifted below 0V over the retention period that elapsed since programming.

As yet another example of a corrective action, R/W unit may apply one or more programming pulses to word line N, in order to increase the threshold voltages of the memory cells and enable successful readout. Further alternatively, system 20 may apply any other suitable corrective action in order to enable successful readout of the last-programmed word line in a partially-programmed memory block.

The MSP may decide to apply the readout-time corrective actions for various reasons. For example, the MSP may maintain a list of blocks that are currently partially-programmed. If a block appears on this list, the MSP may conclude that corrective action is needed for reading the last-programmed word line of this block. In alternative embodiments, the memory device may provide one or more status flags for each word line, which indicate the programming status of the word line. The MSP may read these flags and determine whether the block has un-programmed word lines. As another example, when preparing to read a given word line, the MSP may attempt to read the next word line in the block and sense whether it is programmed or erased.

Figure 5:
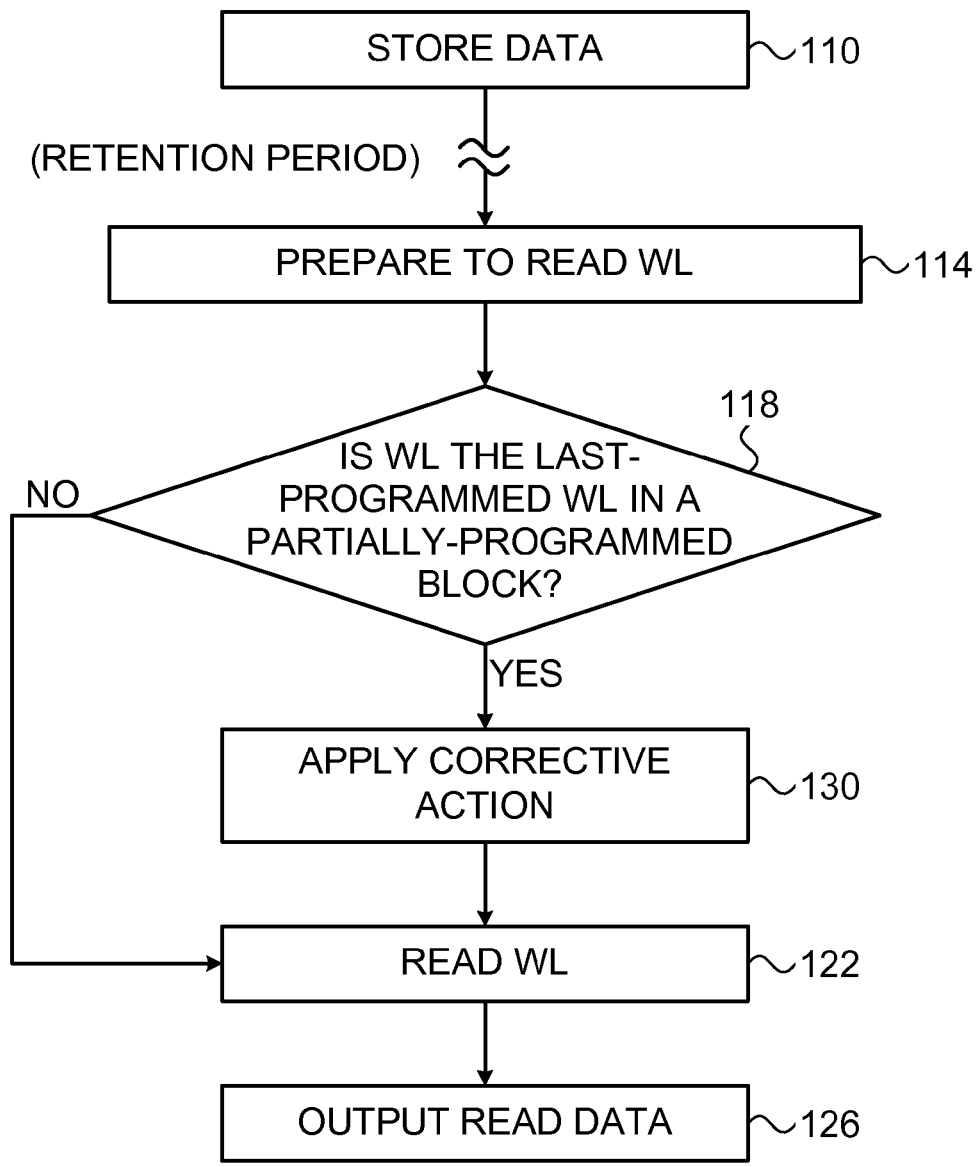
FIG. 5 is a flow chart that schematically illustrates a method for data readout from a partially-programmed memory block, in accordance with an embodiment of the present invention.

FIG. 5 is a flow chart that schematically illustrates a method for data readout from a partially-programmed memory block, in accordance with an embodiment of the present invention. The method begins with MSP 40 storing data in memory device 24, at a storage step 110. After a certain retention period, the MSP prepares to read data from a certain word line WL, at a read preparation step 114. In particular, the MSP checks whether this word line is the last-programmed word line in a partially-programmed block, at a checking step 118. If the word line is not the last-programmed word line in a partially-programmed block, the MSP assumes that the word line has been re-programmed properly. Therefore, the MSP proceeds to read the data from the word line, at a readout step 122. The MSP outputs the read data, at an output step 126.

If, on the other hand, the MSP determines that the word line is the last-programmed word line in a partially-programmed block, it may assume that this word line has not been re-programmed properly. Therefore, the MSP applies a corrective action, at a readout-time correction step 130. The MSP may apply any of the corrective actions described above, for example. After applying the corrective action, the MSP reads the word line, at readout step 122. The MSP then outputs the read data, at output step 126.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
   in a memory that includes multiple analog memory cells, defining an erased state, a set of non-erased programming states and a partial subset of the non-erased programming states;
   initially storing data in a first group of the analog memory cells by programming each of at least some of the memory cells in the first group from the erased state to a respective non- erased programming state selected from the set of non-erased programming states;
   after initially storing the data, programming a second group of the analog memory cells, which potentially cause interference to the first group; and
   after programming the second group, selectively re-programming the first group with the data by repeating programming of only the memory cells in the first group whose respective programming states belong to the partial subset.

2. The method according to claim 1, wherein programming the memory cells comprises writing respective storage values into the memory cells, and wherein defining the partial subset comprises including in the partial subset at least a non-erased programming state corresponding to a lowest range of the analog values among the non-erased memory states.

3. The method according to claim 1, wherein programming the memory cells comprises writing respective storage values into the memory cells, and wherein defining the partial subset comprises including in the partial subset at least a non-erased programming state corresponding to a highest range of the analog values among the non-erased memory states.

4. The method according to claim 1, wherein detecting that the programming of the second group is postponed comprises detecting that a time that elapsed since the programming of the second group exceeds a predefined maximum value.

5. The method according to claim 1, wherein detecting that the programming of the second group is postponed comprises determining that shut-off of electrical power is imminent.

6. The method according to claim 1, wherein applying the corrective action comprises programming the second group with dummy data, so as to cause re-programming of the first group.

7. The method according to claim 1, wherein applying the corrective action comprises sensing at least one analog value that was written into a respective analog memory cell in the first group and has become negative.

8. The method according to claim 1, wherein applying the corrective action comprises applying one or more programming pulses to at least one of the memory cells in the first group.

9. Apparatus for data storage, comprising:
   a memory, which comprises multiple analog memory cells; and
   circuitry, which is configured to define an erased state, a set of non-erased programming states and a partial subset of the non-erased programming states, to initially store data in a first group of the analog memory cells by programming each of at least some of the memory cells in the first group from the erased state to a respective non-erased programming state selected from the set of non-erased programming states, to program a second group of the analog memory cells, which potentially cause interference to the first group, after initially storing the data, and, after programming the second group, to selectively re-program the first group with the data by repeating programming of only the memory cells in the first group whose respective programming states belong to the partial subset.

10. The apparatus according to claim 9, wherein the circuitry is configured to program the memory cells by writing respective storage values into the memory cells, and wherein the partial subset comprises at least a non-erased programming state corresponding to a lowest range of the analog values among the non-erased memory states.

11. The apparatus according to claim 9, wherein the circuitry is configured to program the memory cells by writing respective storage values into the memory cells, and wherein the partial subset comprises at least a non-erased programming state corresponding to a highest range of the analog values among the non-erased memory states.

12. The apparatus according to claim 9, wherein the circuitry is configured to detect that the programming of the second group is postponed by detecting that a time that elapsed since the programming of the second group exceeds a predefined maximum value.

13. The apparatus according to claim 9, wherein the circuitry is configured to detect that the programming of the second group is postponed by determining that shut-off of electrical power is imminent.

14. The apparatus according to claim 9, wherein the corrective action comprises programming the second group with dummy data, so as to cause re-programming of the first group.

15. The apparatus according to claim 9, wherein the corrective action comprises sensing at least one analog value that was written into a respective analog memory cell in the first group and has become negative.

16. The apparatus according to claim 9, wherein the corrective action comprises applying one or more programming pulses to at least one of the memory cells in the first group.

17. Apparatus for data storage, comprising:
   an interface, which is configured to communicate with a memory that includes multiple analog memory cells; and
   circuitry, which is configured to define an erased state, a set of non-erased programming states and a partial subset of the non-erased programming states, to initially store data in a first group of the analog memory cells by programming each of at least some of the memory cells in the first group from the erased state to a respective non-erased programming state selected from the set of non-erased programming states, to program a second group of the analog memory cells, which potentially cause interference to the first group, after initially storing the data, and, after programming the second group, to selectively re-program the first group with the data by repeating programming of only the memory cells in the first group whose respective programming states belong to the partial subset.

* * * * *